United States Patent
Sim et al.

(10) Patent No.: US 9,947,546 B2
(45) Date of Patent: Apr. 17, 2018

(54) SEMICONDUCTOR INTEGRATED CIRCUIT DEVICE WITH A SURFACE AND METHOD OF MANUFACTURING THE SAME

(71) Applicant: SK hynix Inc., Icheon-si, Gyeonggi-do (KR)

(72) Inventors: Jae Hee Sim, Icheon-si (KR); Min Seok Son, Icheon-si (KR); Keun Kyu Kong, Icheon-si (KR); Jeong Hoon An, Icheon-si (KR)

(73) Assignee: SK hynix Inc, Icheon-si, Gyeonggi-do (KR)

( * ) Notice: Subject to any disclaimer, the term of this patent is extended or adjusted under 35 U.S.C. 154(b) by 0 days.

(21) Appl. No.: 15/138,337

(22) Filed: Apr. 26, 2016

(65) Prior Publication Data
US 2017/0207098 A1    Jul. 20, 2017

(30) Foreign Application Priority Data
Jan. 19, 2016    (KR) ........................ 10-2016-0006368

(51) Int. Cl.
*H01L 29/06*    (2006.01)
*H01L 21/306*    (2006.01)
*H01L 21/324*    (2006.01)
*H01L 21/308*    (2006.01)

(52) U.S. Cl.
CPC .... *H01L 21/30604* (2013.01); *H01L 21/3085* (2013.01); *H01L 21/324* (2013.01); *H01L 29/0657* (2013.01)

(58) Field of Classification Search
CPC ... H01L 21/306; H01L 21/308; H01L 21/324; H01L 29/06
See application file for complete search history.

(56) References Cited

U.S. PATENT DOCUMENTS

| | | | |
|---|---|---|---|
| 5,824,360 A * | 10/1998 | Nagashima | ....... H01L 21/31053 257/E21.244 |
| 6,115,747 A | 9/2000 | Billings et al. | |
| 2014/0225184 A1* | 8/2014 | Colinge | .............. H01L 29/7827 257/329 |

FOREIGN PATENT DOCUMENTS

| KR | 1020080061997 A | 7/2008 |
|---|---|---|
| KR | 1020140139946 A | 12/2014 |

\* cited by examiner

*Primary Examiner* — Elias M Ullah
(74) *Attorney, Agent, or Firm* — William Park & Associates Ltd.

(57) ABSTRACT

A semiconductor integrated circuit device and a method of manufacturing the same are disclosed. A semiconductor wafer having a surface step is prepared. A first material layer is formed on an upper surface of the semiconductor wafer so that a protrusion is formed in a portion thereof corresponding to an edge region of the semiconductor wafer. A second material layer is formed on the first material layer.

17 Claims, 6 Drawing Sheets

SEMICONDUCTOR INTEGRATED CIRCUIT DEVICE WITH A SURFACE AND METHOD OF MANUFACTURING THE SAME

CROSS-REFERENCES TO RELATED APPLICATION

This application claims priority under 35 U.S.C. 119(a) to Korean application No. 10-2016-0006368, filed on Jan. 19, 2016, in the Korean intellectual property Office, which is incorporated by reference in its entirety as set forth in full.

BACKGROUND

1. Technical Field

Various embodiments generally relate to a semiconductor integrated circuit device and a method of manufacturing the same, and more particularly, to a semiconductor integrated circuit device with a surface and a method of manufacturing the same.

2. Related Art

Due to an increase in the integration degree of a semiconductor device, processes for forming fine patterns and multi-layered wirings are required. To form the fine patterns and the multi-layered wirings The photolithography process using a fine light source is necessary. Additionally, the global planarization of a wafer surface may be increasingly important to carry out the fine photolithography process.

Recently, planarization processes may include a chemical mechanical polishing (CMP) process. This CMP process is now widely used. The CMP process is a processing method whereby a chemical removing process and a mechanical removing process are integrated. The CMP process is a method used for planarizing a surface of a wafer with a slurry. The CMP may contain an abrasive and a chemical material. The slurry may be interposed between the wafer and a polishing pad.

However, due to chemical defects by the abrasive and the slurry, physical detects may be caused by pressure applied by the polishing pad, and the like. Particles and defects may be created and left on the wafer surface. An edge region of the wafer may be vulnerable to planarization.

SUMMARY

According to an embodiment, there may be provided a method of a manufacturing a semiconductor integrated circuit device. A semiconductor wafer having a surface step may be prepared. A first material layer may be formed on an upper surface of the semiconductor wafer so that a protrusion is formed in a portion thereof corresponding to an edge region of the semiconductor wafer. A second material layer may be formed on the first material layer.

According to an embodiment, there may be provided a method of manufacturing a semiconductor integrated circuit device. A semiconductor wafer having warpage may be prepared. A first material layer, which defines a receiving space by including a protrusion, may be formed on a surface of the semiconductor wafer. A planar surface of the semiconductor wafer may be provided by providing a second material layer having a different property from the first material layer in the receiving space on the first material layer.

According to an embodiment, there may be provided a semiconductor integrated circuit device including a semiconductor wafer having a non-planar surface. The semiconductor integrated circuit device may include a first material layer which is formed along an upper surface of the semiconductor wafer to a first thickness and defines a receiving space by including a protrusion protruding to a second thickness larger than the first thickness in a portion thereof corresponding to an edge region of the semiconductor wafer. The semiconductor integrated circuit device may include a second material layer which is filled within the receiving space of the first material layer to provide a planar surface of the semiconductor wafer.

DETAILED DESCRIPTION

Figure 1:
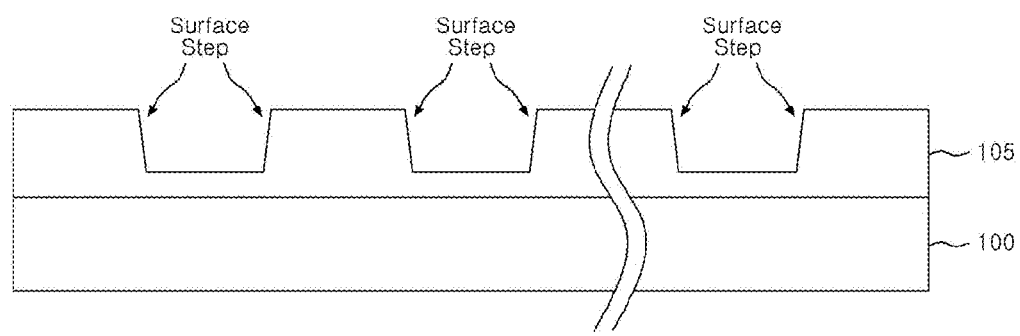
FIGS. 1 to 4 are cross-sectional views illustrating representations of examples for a method of manufacturing a semiconductor integrated circuit device according to an embodiment.

Hereinafter, examples of embodiments will be described below with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, examples of embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The concepts are described herein with reference to cross-section and/or plan illustrations that are schematic illustrations of idealized examples of embodiments. However, embodiments of the concepts should not be limited. Although a few embodiments of the concepts will be illustrated and described, it will be appreciated by those of ordinary skill in the art that changes may be made in these examples of embodiments without departing from the principles and spirit of the disclosure.

Referring to FIG. 1, a wafer 100 including a step in an upper surface thereof may be prepared. The semiconductor wafer 100 may include a predetermined circuit layer 105 on the upper surface, and the surface step may be formed on a resultant of the semiconductor wafer 100 by the circuit layer 105.

Figure 2:
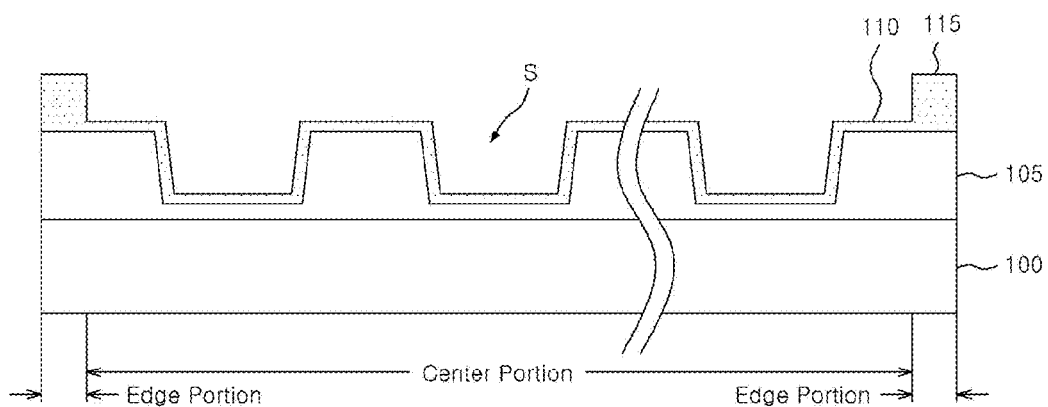
Figure 6:
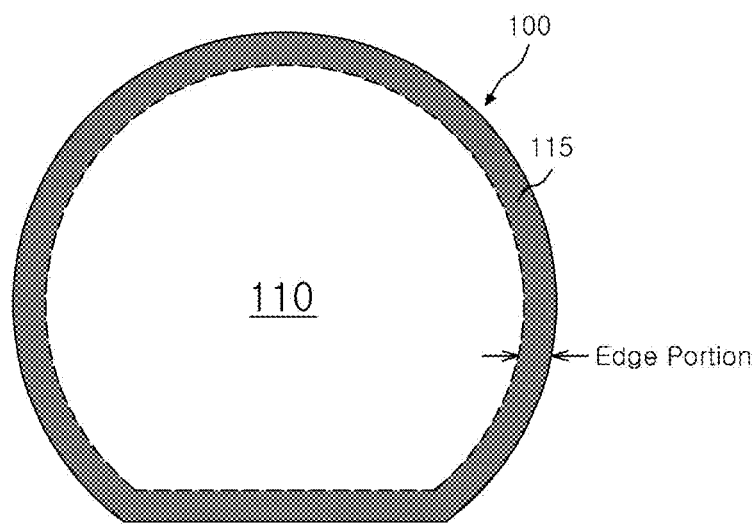
FIG. 6 is a top view illustrating a representation of an example of a semiconductor wafer according to an embodiment.

Referring to FIGS. 2 and 6, a first material layer 110 may be formed on the upper surface of the semiconductor wafer 100 having the step. The first material layer 110 may be formed along the surface step of the circuit layer 105 on the semiconductor wafer 100 to a conformal thickness or substantially a conformal thickness. A material in which a protrusion 115 having a fixed height may be generated in an edge portion of the semiconductor wafer 100 may be used as the first material layer 110. In an embodiment, the protrusion 115 protrudes to have a thickness larger than that of the first material layer 110 located in a center portion of the semiconductor wafer 100, thereby defining a space for receiving the second material layer 120. For example, the protrusion 115 may be an edge bead of the semiconductor wafer 100.

In an example of an embodiment, a receiving space S in which a second material layer (see 120 of FIG. 4) is to be formed later may be defined using the protrusion (hereinafter, referred to as the edge bead) 115 as a dam by controlling a height of the edge bead 115. In general, when a material having viscosity is formed through a spin coating method, the material is pushed into the edge of the semiconductor wafer, and thus the edge bead may be generated in the edge of the semiconductor wafer 100. The edge bead generation is disclosed in a number of U.S. patents in addition to U.S. Pat. No. 6,115,747.

The first material layer 110 may be formed through a spin coating method using a material having sufficient viscosity so that the edge bead 115 having a sufficient thickness may be formed in the edge portion of the semiconductor wafer.

For example, the material for the first material layer 110 may include any one selected from the group consisting of a photoresist material, a bottom antireflective coating (BARC) material, a resolution enhancement of lithography by assist of chemical shrink (RELACS) material, a multi-function hard mask (MFHM) material, a top coater material, a spin on dielectric (SOD) material, a spin on carbon (SOC) material, and a polyimide material. The first material layer 110 may include a multichain, and the first material layer 110 may be formed along the surface of the semiconductor wafer 100 to a conformal thickness.

Figure 5:
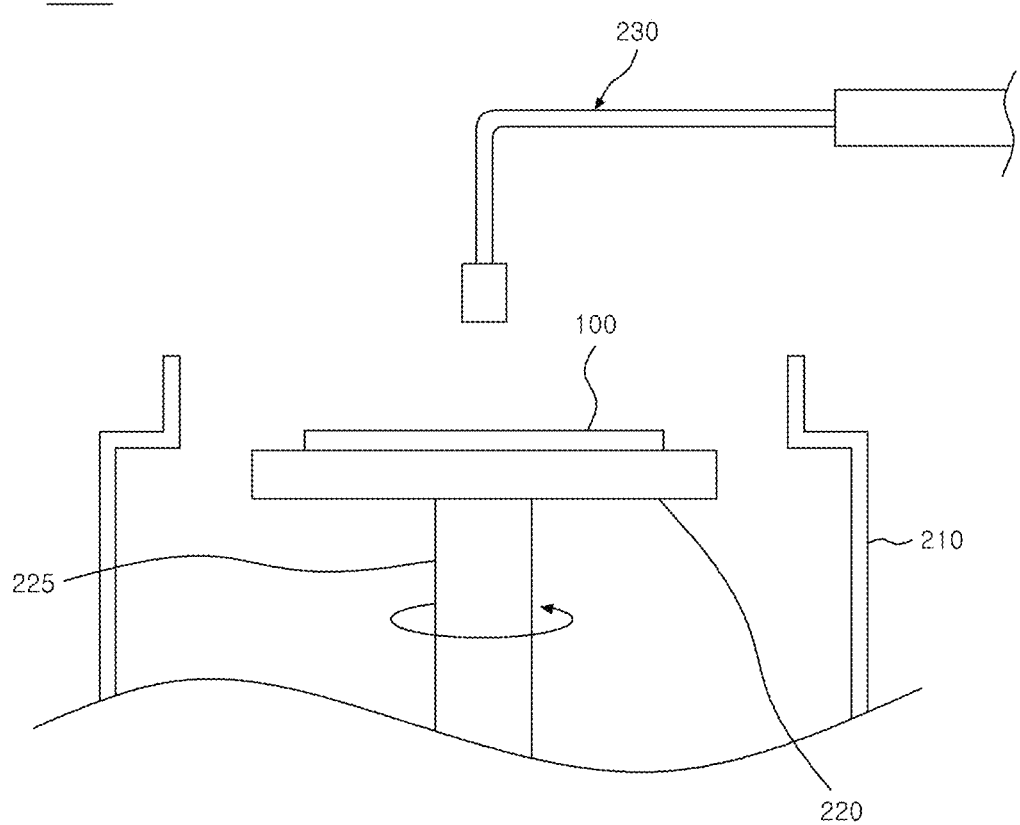
FIG. 5 is a schematic cross-sectional view illustrating a representation of an example of an apparatus for forming a first material layer according to an embodiment.

Referring to FIG. 5, a spin coating apparatus 200 for forming the first material layer 110 may include a bowl 210, a spin chuck 220, and a spray nozzle 230. The semiconductor wafer 100 may be placed on an upper surface of the spin chuck 220, and the spin chuck 220 may be rotated at a certain RPM. The spin chuck 220 may be supported by a supporter 225, and the supporter 225 may receive rotation force from a rotation motor (not illustrated). The bowl 210 may receive the spin chuck 220 and a top of the bowl 210 may have an opened structure. The bowl 210 may function to prevent a material sprayed onto the semiconductor wafer 100 from being splattered to the outside when the spin chuck 220 is rotated.

The first material layer 110 may be formed by coating a material sprayed from the spray nozzle 230 on the surface of the semiconductor wafer 100 to have a certain thickness through the rotation of the spin chuck 220.

The thickness of the first material layer 110 and the thickness of the edge bead 115 may be varied according to the surface step of the semiconductor wafer 100, but the thickness of the edge bead 115 may be set 15 to 25 times larger than that of the first material layer 110 to perform a function of the dam.

The thickness of the edge bead 115 may be changed by controlling a supply amount of the material for the first material layer and a rotation rate and/or a coating time of the spin chuck 220.

Figure 3:
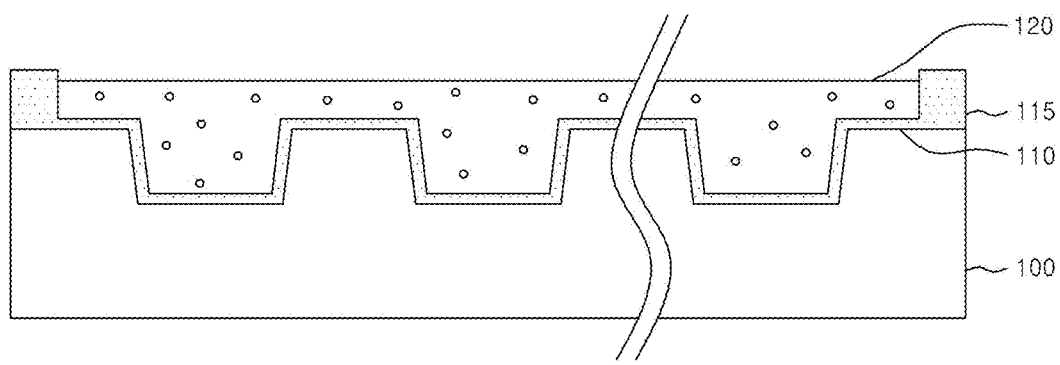

Referring to FIG. 3, a second material layer 120 may be formed to be filled within the receiving space S on the first material layer 110 having the edge bead 115. That is, the second material layer 120 may be formed outside the edge region defined by the edge bead 115. For example, the second material layer 120 is substantially formed on the center portion. Before the second material layer 120 is formed, a surface treatment process on the first material layer 110 may be further performed to prevent the first material layer 110 from being mixed with the second material layer 120 and to prevent the first material layer 110 from being deformed. For example, the surface treatment process may include a crosslinking treatment process on the surface of the first material layer 110 or a process of removing a solvent contained in the first material layer 110. In general, the crosslinking treatment process and the solvent removing process may be accomplished through a curing treatment process.

To improve an adhesion characteristic between the first material layer 110 and the second material layer 120, a surface treatment process may be performed on the first material layer 110 to have a hydrophilic surface before the second material layer 120 is formed.

The first material layer 110 and the second material layer 120 may necessarily include materials which are removed by different solvents. For example, when the first material layer 110 is water-soluble, the second material layer 120 is oil-soluble. When the first material layer 110 is oil-soluble, the second material layer 120 is water-soluble.

The second material layer 120 formed on the first material layer 110 may be formed of a material having a second viscosity smaller than a first viscosity of the first material layer 110 or a material having no viscosity. A monomer material or a monomer type polymer having a single chain may be used as the second material layer 120.

Figure 7:
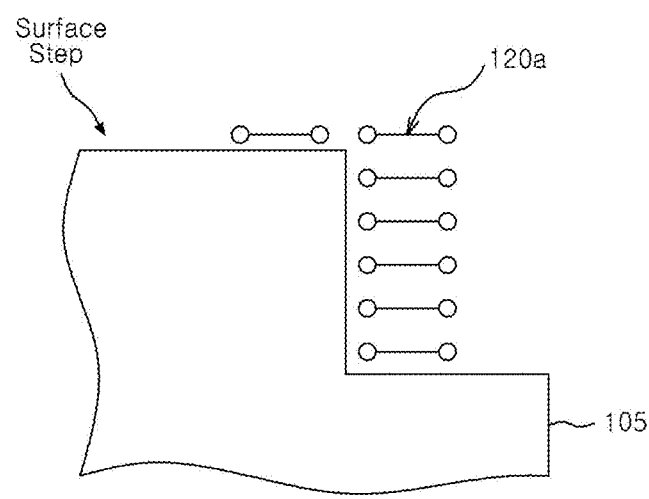
FIG. 7 is a view illustrating a representation of an example of a process of forming a second material layer according to an embodiment.

Accordingly, referring to FIG. 7, since the second material layer 120 has a single chain differently from the first material layer 110, the second material layer 120 may be formed in such a manner that a monomer material or a monomer type polymer 120a is stacked in the step portion. Accordingly, the second material layer 120 may have a good interlayer gap-fill characteristic.

The first material layer 110 and the second material layer 120 may be formed of the following materials.

For example, when the first material layer 110 is a hydrophilic photoresist material, the second material layer 120 may include any one selected from the group consisting of 4-methyl-2-pentanol, methyl isobutyl carbinol, diisopentyl ether, 1,1'-oxybis(3-methylbutane), 1-1-diethoxypropane, and heptan-3-ol which are a hydrophobic material.

When the first material layer 110 is a photoresist material, the second material layer 120 may include a Resolution enhancement of lithography by assist of chemical shrink (RELACS) material.

When the first material layer 110 is a crosslinking-treated bottom anti-reflective coating (BARC) material, the second material layer 120 may include a photoresist material.

When the first material layer 110 is a crosslinking-treated Spin-on carbon (SOC) material, the second material layer 120 may include a multi-function hard mask (MFHM) material.

Just after the second material layer 120 is coated or when a fixed time elapsed after the second material layer 120 is coated, a planar surface of the second material layer 120 may be maintained in the receiving space S defined by the first material layer 110 and the edge bead 115 due to the property of the second material layer 120.

The second material layer 120 may have a surface like a liquid state. In some embodiments, the surface having the liquid state may be induced by performing an over reflow treatment on the second material layer 120 at a temperature equal to or more than a melting point.

That is, the second material layer 120 may provide a planar surface in the receiving space S defined by the first material layer 110 and the edge bead 115 like a liquid filled within, for example, a water tank.

The second material layer 120 may be formed, for example, through a spin coating method, but the second material layer 120 may be formed through various methods in consideration of the property.

A curing treatment may be performed on the second material layer 120 having the planar surface so that the planar surface may be maintained. Accordingly, the complete planarization for the resultant of the semiconductor wafer 100 may be accomplished.

Figure 4:
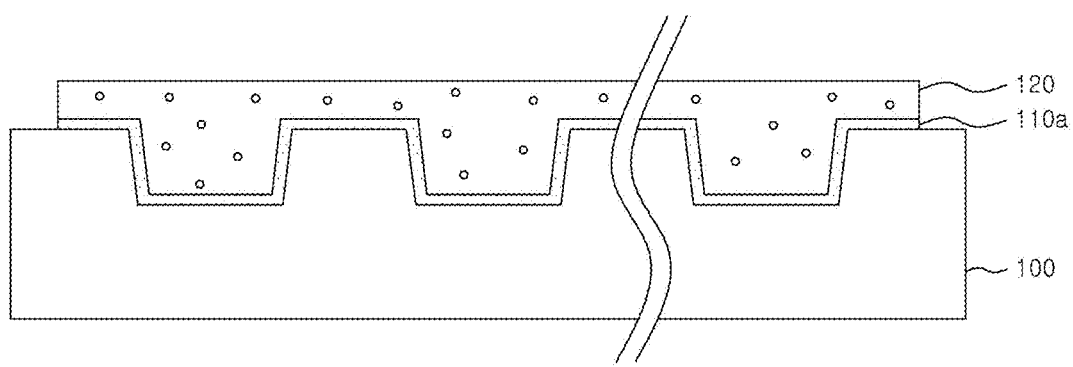

Referring to FIG. 4, the exposed edge bead 115 may be selectively removed using a certain solvent. Since the first material layer 110 constituting the edge bead 115 and the second material layer 120 are formed of the materials which are melted by different solvents, only the edge bead 115 may be selectively removed.

Figure 8:
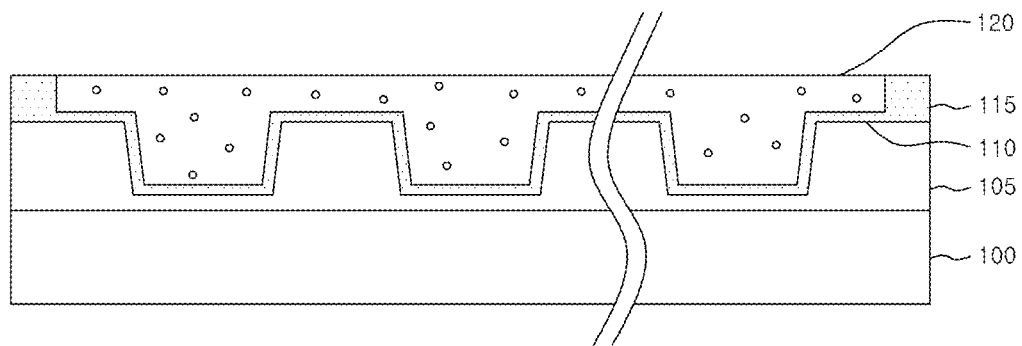
FIGS. 8 to 10 are cross-sectional views illustrating representations of examples of semiconductor integrated circuit devices according to an embodiment.

When the heights of the edge bead 115 and the second material layer 120 are substantially the same as each other, the edge bead 115 may not be removed but may be left as substantially illustrated in FIG. 8.

According to an embodiment, the second material layer 120 having a liquid form may be filled within the space on the semiconductor wafer defined by the first material layer using the edge bead generated in coating of the first material layer having viscosity as a dam. Accordingly, the complete planarization for the resultant of the semiconductor wafer 100 may be accomplished without a separate CMP process.

The embodiments have described the method of planarizing the semiconductor wafer having the surface step. However, as illustrated in FIGS. 9 and 10, the planarization method may be equally applied even when warpages w1 and w2 are generated in semiconductor wafers 100w1 and 100w2.

Figure 9:
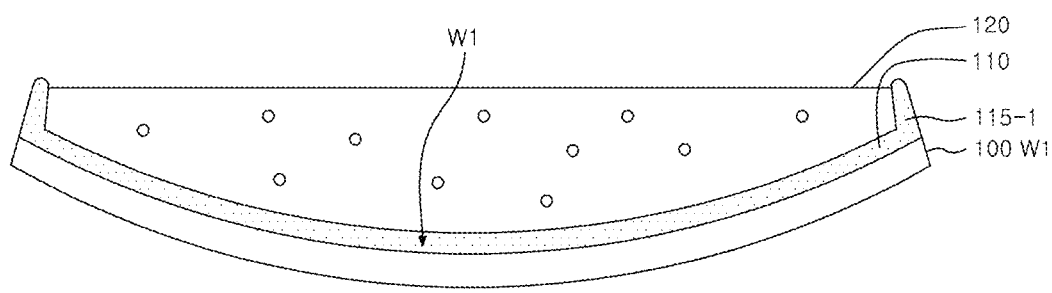

Referring to FIG. 9, when the concave warpage w1 is generated, an edge bead 115-1 may be formed to have a smaller height than that of the edge bead 115 formed on the non-warped semiconductor wafer 100 as illustrated in FIGS. 1 to 4, and thus the global planarization may be accomplished.

Figure 10:
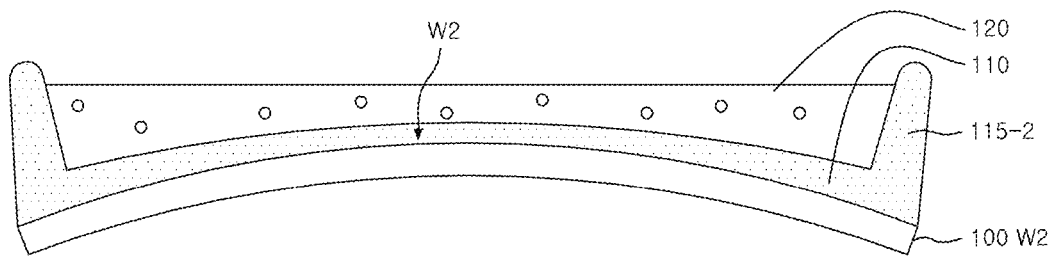

Referring to FIG. 10, when the convex warpage w1 is generated, an edge bead 115-2 may be formed to have a larger height than that of the edge bead 115 formed on the non-warped semiconductor wafer 100 as illustrated in FIGS. 1 to 4, and thus the global planarization may be accomplished.

Figure 11:
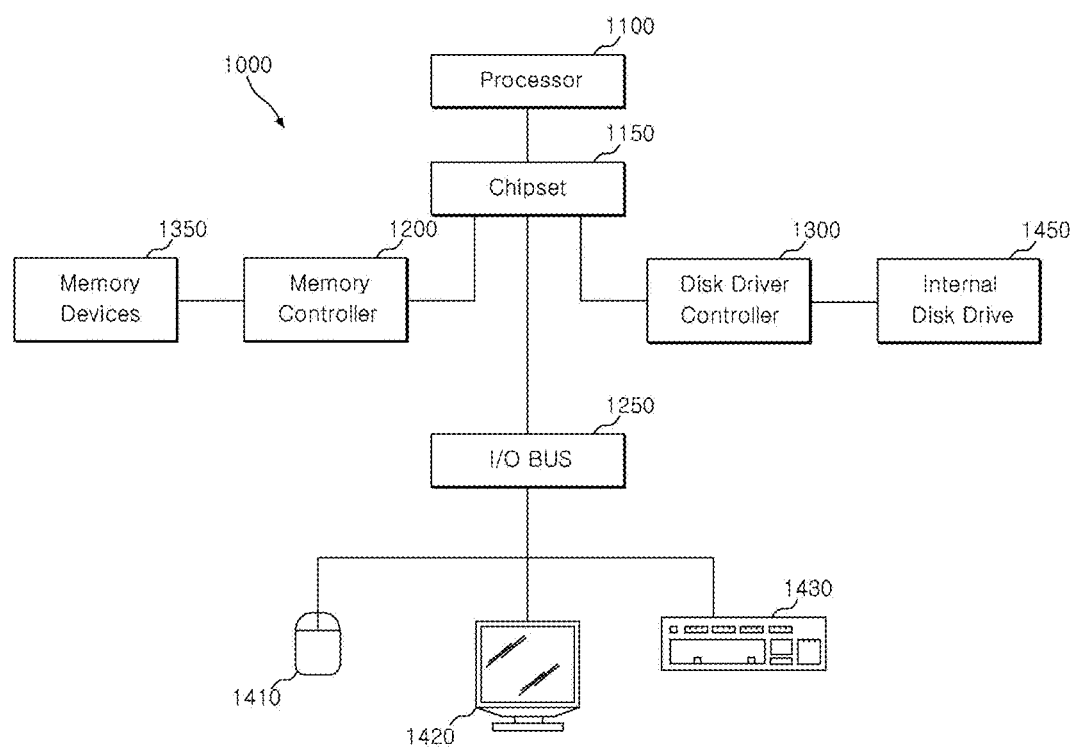
FIG. 11 illustrates a block diagram of an example of a representation of a system employing a semiconductor integrated circuit device or method of manufacturing the semiconductor integrated circuit device with the various embodiments discussed above with relation to FIGS. 1-10.

The semiconductor integrated circuit device or method of manufacturing the semiconductor integrated circuit device as discussed above (see FIGS. 1-10) are particular useful in the design of memory devices, processors, and computer systems. For example, referring to FIG. 11, a block diagram of a system employing a semiconductor integrated circuit device or method of manufacturing the semiconductor integrated circuit device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor integrated circuit device as discussed above with reference to FIGS. 1-10. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor integrated circuit device as discussed above with relation to FIGS. 1-10, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 11 is merely one example of a system 1000 employing a semiconductor integrated circuit device or method of manufacturing the semiconductor integrated circuit device as discussed above with relation to FIGS. 1-10. In alternate embodiments, such as, for example but not limited to, cellular phones or digital cameras, the components may differ from the embodiments illustrated in FIG. 11.

The above embodiments are illustrative and not limitative. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A method of manufacturing a semiconductor integrated circuit device, the method comprising:
   preparing a semiconductor wafer having a circuit layer, the circuit layer including a surface step;
   forming a first material layer on the circuit layer of the semiconductor wafer along the surface step so that a protrusion is formed on a portion of the first material layer corresponding to an edge region of the semiconductor wafer; and
   forming a second material layer on the first material layer, wherein a space is defined on the first material layer by the protrusion and the second material is filled within the space to have a planar surface, and
   wherein the first material layer and the second material layer are removed by different solvents.

2. The method of claim 1, wherein the protrusion protrudes to have a thickness larger than that of the first material layer located in a center portion of the semiconductor wafer, thereby defining the space for receiving the second material layer.

3. The method of claim 1, wherein the forming of the first material layer includes forming the first material layer through spinning the first material layer to push the first material layer into the edge region of the semiconductor wafer.

4. The method of claim 1, wherein the first material layer is formed of a material having a first viscosity, and
   the second material layer is formed of a material having a second viscosity smaller than the first viscosity.

5. The method of claim 1, wherein the material for the first material layer includes any one selected from the group consisting of a photoresist material, a bottom antireflective coating (BARC) material, a resolution enhancement of lithography by assist of chemical shrink (RELACS) material, a multifunction hard mask (MFHM) material, a top coater material, a spin on dielectric (SOD) material, a spin on carbon (SOC) material, and a polyimide material.

6. The method of claim 1, wherein the second material layer is removable through a different solvent than what the first material layer is capable of being removed with.

7. The method of claim 1, wherein the first material layer includes a material having a multichain, and
   the second material layer includes a monomer material or a monomer type polymer.

8. The method of claim 1, wherein the second material layer has a liquid state, and
   the second material layer is filled within a space defined by the first material layer and the protrusion of the first material layer.

9. The method of claim 1, further comprising:
   performing a crosslinking treatment on a surface of the first material layer between the forming of the first material layer and the forming of the second material layer.

10. The method of claim 1, further comprising:
    removing a solvent contained in the first material layer between the forming of the first material layer and the forming of the second material layer.

11. The method of claim 1, further comprising:
    performing a surface treatment process on the first material layer prior to forming the second material layer.

12. The method of claim 11, wherein the surface treatment process of the first material layer creates a hydrophilic surface on the first material layer.

13. The method of claim 1, further comprising curing the first material layer between the forming of the first material layer and the forming of the second material layer.

14. The method of claim 1, further comprising curing the second material layer after the forming of the second material layer.

15. The method of claim 14, further comprising selectively removing an exposed protrusion after the curing of the second material layer.

16. A method of manufacturing a semiconductor integrated circuit device, the method comprising:
    preparing a semiconductor wafer having warpage;
    forming a first material layer, which defines a receiving space by including a protrusion, along a surface of the semiconductor wafer;
    providing a planar surface of the semiconductor wafer by providing a second material layer having a different property from the first material layer in the receiving space on the first material layer,
    wherein the second material layer has a liquid state, and
    wherein the first material layer and the second material layer have different ingredients removed by different solvents.

17. The method of claim 16, further comprising curing the second material layer.

* * * * *